United States Patent
Chaudron

(10) Patent No.: US 9,692,097 B2
(45) Date of Patent: Jun. 27, 2017

(54) POWER-GENERATING SYSTEM HAVING A FUEL CELL

(71) Applicant: AREVA Stockage d'Energie, Aix en Provence (FR)

(72) Inventor: Valery Chaudron, Manosque (FR)

(73) Assignee: AREVA STOCKAGE D'ENERGIE, Aix en Provence (FR)

( * ) Notice: Subject to any disclaimer, the term of this patent is extended or adjusted under 35 U.S.C. 154(b) by 194 days.

(21) Appl. No.: 14/652,222

(22) PCT Filed: Dec. 11, 2013

(86) PCT No.: PCT/EP2013/076293
§ 371 (c)(1),
(2) Date: Jun. 15, 2015

(87) PCT Pub. No.: WO2014/102064
PCT Pub. Date: Jul. 3, 2014

(65) Prior Publication Data
US 2015/0340749 A1    Nov. 26, 2015

(30) Foreign Application Priority Data
Dec. 24, 2012 (FR) ...................................... 1262761

(51) Int. Cl.
*H01M 16/00* (2006.01)
*H01M 8/04007* (2016.01)
(Continued)

(52) U.S. Cl.
CPC .......... *H01M 16/003* (2013.01); *H01L 35/30* (2013.01); *H01M 8/04029* (2013.01);
(Continued)

(58) Field of Classification Search
CPC ....... H02P 9/04; Y10T 307/658; Y02B 90/14; Y02B 90/12
(Continued)

(56) References Cited

U.S. PATENT DOCUMENTS

2006/0003193 A1    1/2006 Stabler et al.

FOREIGN PATENT DOCUMENTS

| EP | 1 482 254 A1 | 12/2004 |
|---|---|---|
| JP | H08 22832 A | 1/1996 |

(Continued)

OTHER PUBLICATIONS

Search Report for corresponding International Application PCT/EP2013/076293.

*Primary Examiner* — Robert Deberadinis
(74) *Attorney, Agent, or Firm* — Davidson, Davidson & Kappel, LLC

(57) ABSTRACT

A power-generating system is provided including a fluid-tight chamber and an electricity-generating assembly arranged in the chamber, the electricity-generating assembly comprising a fuel cell for generating power by means of an oxidation-reduction reaction between an oxidizer and a fuel, and a supply system for supplying oxidizer and fuel to the fuel cell, the power-generating system also including a heat-control system including a cold source and a hot source, and a heat-transport fluid circuit that is configured to control the temperature of the electricity-generating assembly by exchanging heat with the cold source and the hot source.

18 Claims, 1 Drawing Sheet

(51) Int. Cl.
*H01M 8/241* (2016.01)
*H01M 8/2425* (2016.01)
*H01M 8/1246* (2016.01)
*H01M 8/1018* (2016.01)
*H01L 35/30* (2006.01)
*H01M 8/2475* (2016.01)
*H01M 8/04029* (2016.01)
*H01M 8/124* (2016.01)

(52) U.S. Cl.
CPC ... *H01M 8/04052* (2013.01); *H01M 8/04074* (2013.01); *H01M 8/1018* (2013.01); *H01M 8/1246* (2013.01); *H01M 8/241* (2013.01); *H01M 8/2425* (2013.01); *H01M 8/2475* (2013.01); *H01M 16/006* (2013.01); *H01M 2008/1095* (2013.01); *H01M 2008/1293* (2013.01); *H01M 2250/10* (2013.01); *H01M 2250/402* (2013.01); *H01M 2300/0074* (2013.01); *H01M 2300/0082* (2013.01); *Y02B 90/12* (2013.01); *Y02B 90/14* (2013.01); *Y10T 307/658* (2015.04)

(58) Field of Classification Search
USPC .................................................. 307/150
See application file for complete search history.

(56) References Cited

FOREIGN PATENT DOCUMENTS

| | | |
|---|---|---|
| JP | H 10 64561 A | 3/1998 |
| JP | 2003 151595 A | 5/2003 |
| JP | 2006 147315 A | 6/2006 |
| JP | 2007 134241 A | 5/2007 |
| JP | 2010 272462 A | 12/2010 |

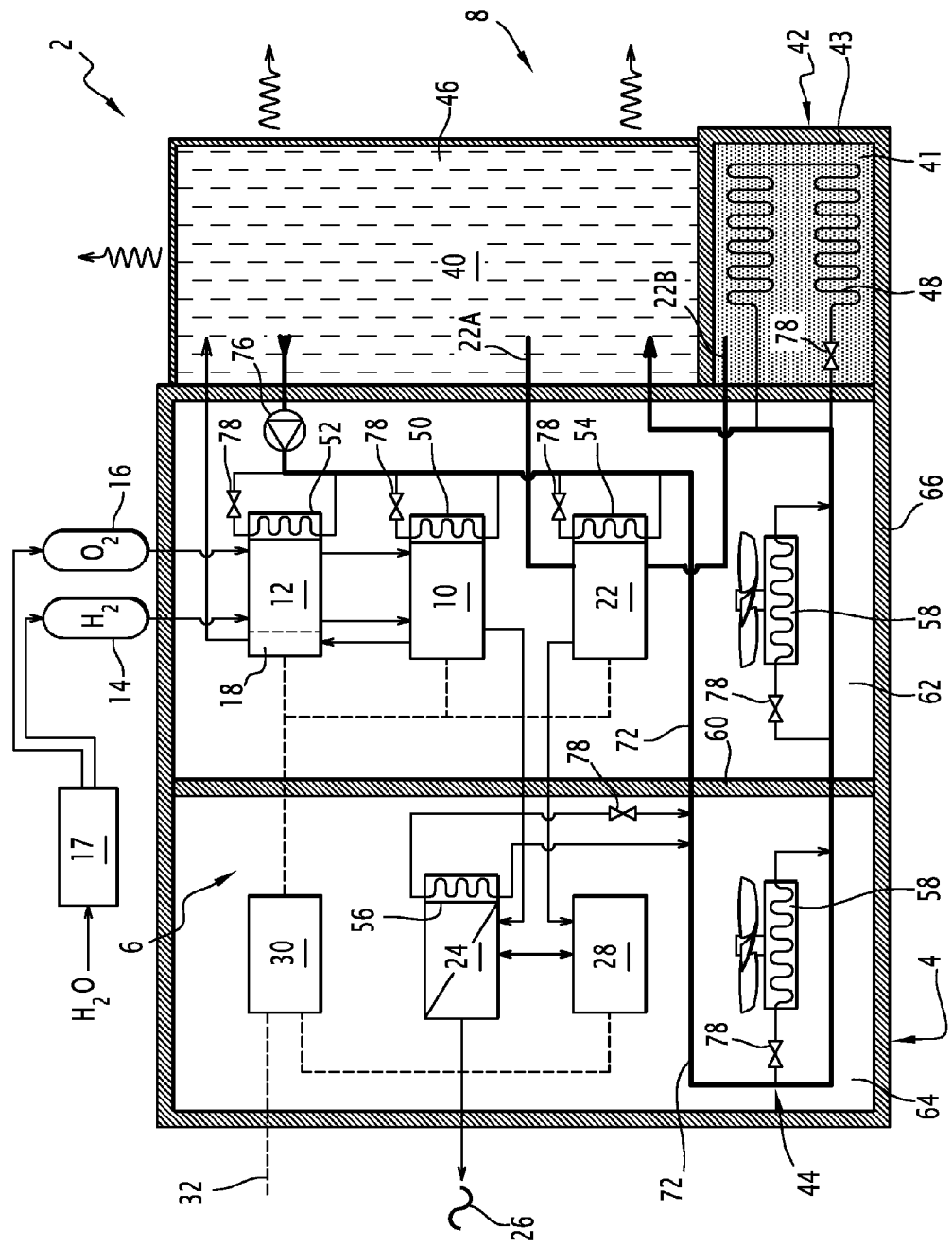

POWER-GENERATING SYSTEM HAVING A FUEL CELL

The present invention relates to power-generating systems having a fuel cell that produces electricity by oxidation-reduction of a fuel and an oxidizer.

Such power-generating systems are used as backup power sources in case of failure of the electric grid, to supply power to buildings or sensitive facilities requiring continuous operation for at least some of their equipment, such as a hospital or nuclear power plant. A failure in the electric grid may for example be caused by a natural disaster, such as a flood, earthquake, meteorological event (cyclone, typhoon, tornado, etc.).

BACKGROUND

Such power-generating systems are generally sized to provide backup electricity over a long length of time from several hours to several days.

Such power-generating systems are inactive for long periods of time. The environment in which they must operate is not known in advance (temperature, atmospheric pollution, radiation, flood, etc.).

SUMMARY OF THE INVENTION

It is desirable for such a power-generating system to be able to start and run reliably regardless of the instantaneous environment in which the power-generating system is used.

To that end, a power-generating system is provided comprising a fluid-tight chamber and an electricity-generating assembly arranged in the chamber, the electricity-generating assembly comprising a fuel cell for generating power by means of an oxidation-reduction reaction between an oxidizer and a fuel, and a supply system for supplying oxidizer and fuel to the fuel cell, the power-generating system also including a heat-control system including a cold source and a hot source, and a heat-transport fluid circuit that is configured to control the temperature of the electricity-generating assembly by exchanging heat with the cold source and the hot source.

According to other embodiments, the power-generating system comprises one or more of the following features, considered alone or according to any technically possible combination(s):
- the cold source is positioned outside the chamber and/or the hot source is positioned outside the chamber;
- the cold source is a heat transport fluid reservoir;
- the hot source is a storage device for a phase change material, said heat transport fluid circuit comprising a hot source heat exchanger for a heat exchange between the heat transport fluid and the phase change material;
- the heat transport fluid circuit comprises a fuel cell heat exchanger for the individual heat control of the fuel cell;
- a supply system comprises a fluid management unit configured to control the supply of oxidizer and fuel to the fuel cell;
- the supply system comprises an oxidizer source, for example on oxidizer reservoir, and a fuel source, for example a fuel reservoir;
- the heat transport fluid circuit comprises a fluid management unit heat exchanger for the individual heat control of the fluid management unit;
- the power-generating assembly comprises a power converter positioned inside the chamber and configured to exchange electricity with the fuel cell, the storage, the thermoelectric module, the power grid and/or the user;
- the heat transport fluid circuit comprises a power converter heat exchanger for the individual heat control of the power converter;
- it comprises a power storage device to provide or store electricity;
- the power-generating assembly comprises a thermoelectric module configured to generate electricity due to a difference in temperature;
- the heat transport fluid circuit comprises a heat exchanger of the thermoelectric module for the individual heat control of the thermoelectric module;
- the heat transport fluid circuit comprises at least one chamber heat exchanger for exchanging heat between the inner volume of the chamber and the heat transport fluid;
- the chamber comprises at least two separate compartments, the heat control system comprising a chamber heat exchanger in each compartment for exchanging heat between the inner volume of the compartment and a heat transport fluid;
- the fuel cell and the supply system are positioned in a compartment, and the power converter and the energy storage system in the other compartment;
- the chamber is surrounded by a thermally insulating layer;
- the hot source has a thermally insulating outer enclosure;
- it comprises a fuel source positioned inside the chamber and/or outside the chamber and/or an oxidizer source positioned inside the chamber and/or outside the chamber.

The invention also relates to an operating method for a power-generating system comprising an electricity-generating assembly for producing power, preferably from a fuel and an oxidizer, and at least one power storage device, in which, while waiting for the power-generating assembly to start up, the power-generating system keeps the energy level in the or each energy storage device above a predetermined energy threshold making it possible to start the power-generating assembly.

According to specific embodiments, the power-generating system comprises one or more of the following features, considered alone or according to any technically possible combination(s):
- the power-generating system checks the energy level of the energy storage devices at regular time intervals;
- in case of an energy level below the predetermined threshold, the power-generating system recharges at least one energy storage device with energy so as to go back above the predetermined threshold;
- the power-generating system comprises a power storage device;
- the power-generating system checks the charge level of the power storage device at regular time intervals;
- in case of discharge of the power storage device below a predetermined threshold, the power-generating system recharges the power storage device for example from an outside power source or an internal heat energy storage device, so as to go back above the predetermined threshold;
- while waiting for the power-generating assembly to start up, the power-generating system keeps itself under appropriate temperature conditions for the autonomous start up of the power-generating assembly.

BRIEF SUMMARY OF THE DRAWING

The invention and its advantages will be better understood upon reading the following description, provided solely as a non-limiting example, and done in reference to the sole appended figure, diagrammatically illustrating a power-generating system.

DETAILED DESCRIPTION

The power-generating system 2 illustrated in the figure comprises a tight chamber 4, an electricity-generating assembly 6 comprising power-generating equipment positioned inside the chamber 4, and a heat control system 8 to control the temperature of the electricity-generating assembly 6.

The chamber 4 is configured to be tight with respect to gaseous or liquid fluids. The chamber 4 delimits a closed and fluid-tight inner volume.

The electricity-generating assembly 6 is positioned inside the chamber 4. Each piece of functional equipment of the electricity-generating assembly 6 is positioned inside the chamber 4.

The electricity-generating assembly 6 comprises a fuel cell 10 for producing power by means of an oxidation-reduction reaction between an oxidizer and a fuel. The fuel cell 10 is positioned inside the chamber 4.

The fuel cell 10 comprises at least one electrochemical cell, and preferably several stacked electrochemical cells forming a stack or a set of several stacks. Each electrochemical cell is supplied with fuel and oxidizer and produces power. The electrochemical cells of a same stack are generally fluidly connected in parallel and electrically connected in series.

The fuel cell 10 is for example a proton exchange membrane fuel cell (PEMFC) or a solid oxide fuel cell (SOFC).

The electricity-generating assembly 6 comprises a supply system to supply the fuel cell 10 with fuel and oxidizer, comprising a fluid management unit 12, a fuel source 14 and an oxidizer source 16.

The fluid management unit 12 is configured to supply the fuel cell 10 with oxidizer and fuel from the fuel source 14 and the oxidizer source 16 of the power-generating system 2. The fluid management unit 12 is positioned inside the chamber 4.

In the illustrated example, the fuel cell 10 is a dihydrogen/dioxygen fuel cell. The fuel is dihydrogen ($H_2$) and the oxidizer is dioxygen ($O_2$). During operation, the fuel cell 6 produces water as effluent resulting from the oxidation-reduction reaction.

The fuel source 14 is a dihydrogen reservoir positioned outside the chamber 4. The oxidizer source 16 is a dioxygen reservoir positioned outside the chamber 4. Alternatively, the fuel source 14 is positioned inside the chamber 4 and/or the oxidizer source 16 is positioned inside the chamber 4. Also alternatively, the fuel source and/or the oxidizer source comprises a partial storage inside the chamber completed by a partial storage outside the chamber. Preferably, a nitrogen source is also available inside and/or outside the chamber.

Optionally, the electricity-generating system 2 comprises a hydrogen generator 17 making it possible to supply the fuel source 14 and optionally the oxidizer source 16. Such a hydrogen generator 17 is for example an electrolyzer supplied with water and providing dihydrogen and dioxygen as output. The hydrogen generator is positioned inside or outside the chamber 4.

The fluid management unit 12 fluidly connects the fuel cell 10 to the fuel source 14 and the oxidizer source 16 and controls the fuel and oxidizer flow rates supplying the fuel cell 10.

The fluid management unit 12 comprises a treatment module 18 configured to treat the effluents from the fuel cell 10. The treatment module 18 is in particular configured to transform dihydrogen and dioxygen present in the effluents into water. Dihydrogen and dioxygen may be present in the effluents in small quantities during the operation of the fuel cell 10, or in significantly higher quantities in case of bleeding of the fuel cell 10, for example for inerting of the fuel cell 10.

Optionally, the treatment module 18 is configured to measure the concentration of dioxygen and the concentration of dihydrogen in the chamber 4 to avoid any risk of explosion, and to activate an alert and risk mitigation action (e.g., inerting of the chamber with nitrogen, activation of a recombining system, sprinkling with water or combustion inhibitor) if necessary.

The electricity-generating assembly 6 comprises a thermoelectric module 22 configured to generate power due to a temperature difference. The thermoelectric module 22 is positioned inside the chamber 4.

The thermoelectric module 22 for example uses the Seebeck effect, according to which a difference in electric potential appears between two ends of an electric conductor brought to different temperatures.

The electricity-generating assembly 6 comprises a power converter 24 receiving the power produced by the fuel cell 10. The power converter 24 is positioned inside the chamber 4.

The power converter 24 is provided to supply and receive power with respect to an electric grid 26 interfacing with the power-generating system 2.

The electricity-generating assembly 6 comprises a power storage device 28 for storing power. The power storage device 28 is positioned inside the chamber 4.

The power storage device 28 is for example a battery or a supercapacitor or a mechanical system of the flywheel type. The energy storage device 28 receives electricity supplied by the electric grid 26 and/or electricity produced by the fuel cell 10 and/or electricity produced by the thermoelectric module 22, directly or indirectly via the power converter 24.

The power storage device 28 is electrically connected to the power converter 24 to receive power from the power converter 24 or to supply power to the power converter 24.

The electricity-generating assembly 6 comprises a control unit 30 connected to the other equipment of the electricity-generating assembly 6 to control it. The control unit 30 is positioned inside the chamber 4. It is connected to the outside of the chamber 4 by an outside communication line 32. The control unit is connected to the equipment that it controls through internal communication lines shown in dotted lines in the Figure.

The heat control system 8 is configured to control the temperature of the electricity-generating assembly 6 positioned inside the chamber 4. The heat control system 8 is configured to control the temperature of the different pieces of equipment individually. The heat control system 8 here is also configured to control the temperature of the inner volume of the chamber 4 in which the electricity-generating assembly 6 is located.

The heat control system 8 comprises a cold source 40, a hot source 42 and a heat transport fluid circuit 44 for the circulation of a heat transport fluid.

A cold source 40 is positioned outside the chamber 4. The cold source 40 is formed by a reservoir 46 containing the heat transport fluid. The heat transport fluid reservoir 46 has a significant volume, for example approximately 15 Nm3 of water for a heat storage capacity of 400 kWh. As an illustration, this heat power corresponds to the cumulative heat energy produced for 5 hours for an electricity-generating system of 100 kWe. The heat transport fluid reservoir 46 thus has considerable thermal inertia and its temperature varies slowly, depending on the temperature of the outside environment. The heat transport fluid reservoir 46 has no insulating layer, for heat exchange between the heat transport fluid present in the heat transport fluid reservoir 46 and the outside environment.

The heat transport fluid is for example deionized water, potentially enriched with a component making it possible to decrease the freezing point and/or inhibit corrosion phenomena. In that case, the fluid management unit 12 is for example configured to reinject recovered water from the effluents of the fuel cell toward the cold source 40.

The hot source 42 is a phase change material (PCM) storage device making it possible to store latent heat by phase change of the phase change material, and to return it.

The phase change material has a high latent heat and makes it possible to store a large quantity of heat in the form of latent heat without a temperature increase, and also to return it at a quasi-constant temperature. The temperature remains constant until all of the phase change material changes phase.

The phase change material is preferably a solid-liquid phase change material. It is able to store heat by liquefying and to return heat by solidifying. These phase change materials used in the context of this application are for example, but not solely, encapsulated paraffins having phase change temperature characteristics preferably comprised between 70 and 90° C. and latent heat characteristics greater than 50 kJ/kg, making it possible to achieve heating capability densities greater than 50 kWh/Nm3.

The hot source 42 comprises an enclosure 43 containing the phase change material 41. The enclosure 43 is thermally insulating to limit the heat exchanges between the phase change material 41 and the outside and to limit heat losses.

The heat transport fluid circuit 44 is connected to the cold source 40. In the present case, the heat transport fluid circuit 44 is supplied from the cold source 40.

The heat transport fluid 44 comprises a hot source exchanger 48 positioned in the hot source 42 for a heat exchange between the phase change material and the heat transport fluid circulating in the hot source exchanger 48. Alternatively, the heat transport fluid circulates directly in the reservoir 42 containing the phase change material 41 and exchanges directly with the latter.

The heat transport fluid circuit 44 is configured for the individual heat control of at least some of the pieces of equipment of the electricity-generating assembly 6.

The heat transport fluid circuit 44 supplies heat transport fluid to an individual heat exchanger of each piece of equipment whose temperature is controlled individually.

The heat transport fluid circuit 44 supplies a fuel cell heat exchanger 50 for the individual heat control of the fuel cell by heat exchange between the fuel cell 10 and the heat transport fluid.

The fuel cell heat exchanger 10 is shown diagrammatically. Traditionally, the fuel cell heat exchanger 50 comprises flow channels for the heat transport fluid extending in the stack of electrochemical cells, in particular in the separator plates separating the electrochemical cells.

The heat transport fluid circuit 44 supplies a fluid management unit heat exchanger 52 for the individual heat control of the fluid management unit 12 by heat exchange between the fluid management unit 12 and the heat transport fluid.

The heat transport fluid circuit 44 supplies a thermoelectric module heat exchanger 54 for the individual heat control of the thermoelectric module 22 by heat exchange between the thermoelectric module 22 and the heat transport fluid.

The heat transport fluid circuit 44 supplies a power converter heat exchanger 56 for the individual heat control of the power converter 24 by heat exchange between the power converter 24 and the heat transport fluid.

The heat transport fluid circuit 44 is configured for the heat control of the inner volume of the chamber 4.

To that end, it comprises at least one chamber heat exchanger 58 for the heat control of the inner volume of the chamber by heat exchange between the air contained in the chamber and the heat transport fluid. The heat transport fluid circuit 44 here comprises two chamber heat exchangers 58.

The chamber 4 comprises an inner partition 60 delimiting, inside the chamber 4, a first compartment 62 and a second compartment 64 that are separated from one another by the inner partition 60. The inner partition 60 is fluid-tight. The chamber 4 delimits a closed and fluid-tight inner volume. The chamber 4 may be partially inerted without oxygen in the compartment 62.

The treatment module 18 of the fluid management unit 12 is configured to treat the effluents from the fuel cell 10, in particular configured to transform dihydrogen and dioxygen present in the effluents or in the chamber of the compartment 62 into water, which can be stored or transferred to the cold source 40.

A chamber heat exchanger 58 is positioned in each of the first compartment 62 and the second compartment 64.

The control unit 30, the power converter 24 and the power storage device 28 are positioned in the first compartment 64. The fuel cell 10, the fluid management unit 12 (including the treatment module 18) and the thermoelectric module 22 are positioned in the second compartment 62.

The chamber 4 is surrounded by an insulating layer 66 to thermally insulate the chamber 4 from the outside environment.

The control unit 30 receives temperature measurement signals from the different pieces of equipment positioned inside the chamber 4, the air inside the chamber 4, the cold source 40 and the hot source 42.

In the illustrated example, the heat transport fluid circuit 44 comprises a main heat transport fluid circulation loop 72 on which each heat exchanger is connected in parallel. The heat transport fluid circuit 44 comprises a circulation pump 76 to circulate the heat transport fluid in the main loop 72 and solenoid valves 78 controlled by the control unit 30 controlling the supply of each heat exchanger individually. The main loop 72 is supplied with heat transport fluid in the cold source 40 and emerges in the cold source 40. Other heat transport fluid circuit schemes are possible. The circulation direction of the heat transport fluid and the passage order of the heat transport fluid in the heat exchangers associated with different pieces of equipment can be different by construction or by controlling the control unit 30 based on the operating phases of the electricity-generating assembly 6, the condition of each of the pieces of equipment and the environmental conditions outside the power-generating system 2.

The thermoelectric module 22 is configured to produce electricity due to the temperature difference between the cold source 40 and the hot source 42. It comprises a cold probe 22A submerged in the cold source 40 and a hot probe 22B submerged in the hot source 42.

During operation, when it is necessary to cool one or more pieces of equipment individually or to cool the inner volume of the chamber, the heat transport fluid circuit 44 is controlled by the control unit 30 to circulate the heat transport fluid from the cold source 40 toward the or each appropriate heat exchanger.

If the heat transport fluid is at an appropriate temperature after having recovered the heat in the different heat exchangers in the chamber 4, the heat transport fluid 44 is controlled for the circulation of the heat transport fluid having crossed through the or each heat exchanger activated in the chamber 4 toward the hot source 42. The calories taken by the heat transport fluid in the heat exchangers are provided to the hot source 42 to be stored in the form of latent heat in the hot source 42, for later use.

When it is necessary to heat one or more components individually or the air in the chamber, the heat transport fluid circuit 44 is commanded by the control unit 30 to circulate the heat transport fluid in the hot source 42, then toward the or each appropriate heat exchanger to provide calories to the associated piece of equipment or heat the inner volume of the chamber 4 as a whole. The heat transport fluid is then oriented toward the cold source 40 to be stored.

The power-generating system 2 can be used as a backup power source, to supplement a main power source (e.g., the electric grid 26) that has failed.

The power-generating system 2 is able to go into standby in an inactive phase while waiting to be started up, and to be activated and begin producing electricity via the electricity-generating assembly 6 to generate power in case of a failure of the main electricity source.

The power-generating system 2 on standby can autonomously keep itself under appropriate conditions for start up of the electricity-generating assembly 6 (power storage necessary for start up and/or temperature).

The power-generating system 2 comprising electricity-generating equipment positioned in a fluid-tight chamber 4 makes it possible to isolate that equipment from the outside environment to ensure a reliable startup and operation, including under highly deteriorated conditions in the outside environment. The fluid or electric connections to the outside (electric connection to the electricity grid, electric connection to the communication line, fluid connections to the fuel and oxidizer sources) are done tightly.

The temperature control system 8 makes it possible to keep the equipment in appropriate temperature ranges, whether during an inactive phase during which that equipment is not operating but its integrity must be ensured, or during inactive phase in which that equipment is operating.

The hot source 42 and the cold source 40 are dimensioned to store a sufficient quantity of frigories and a sufficient quantity of calories for a period of inactivity with a specified cumulative length and a period of activity with a specified cumulative length.

During continuous operation, the pieces of equipment and their actuators are supplied with power by the fuel cell 10. The power-generating system 2 is autonomous for its own power supply.

The start up of the power-generating assembly requires an initial contribution of energy, in particular a contribution of power. Energy is stored in the power-generating system, in the form of electric power in the power storage device 28 and in the form of heat energy in the cold 40 and hot 42 sources. The heat power may be converted into electric power by the thermoelectric module 22.

The power storage device 28 and the thermoelectric module 22 make it possible to supply the electrically-controlled actuators of the fuel cell 10 that are necessary for its start up. The redundancy of these two power sources makes it possible to increase the reliability of the start up of the fuel cell 10. Alternatively, it is possible to provide only the power storage device 28 or only the thermoelectric module 22.

The hydrogen generator 17 is supplied with power by the electric grid 26 when the latter has not failed, during a period of inactivity of the fuel cell 10.

The control unit 30 is programmed to keep the power-generating system 2 under appropriate conditions for beginning the production of power autonomously, without an external power source and preferably without a fluid exchange with the outside.

According to an autonomous operating method, the power-generating system keeps itself able to start up autonomously without its outside power source.

In particular, the power-generating system keeps the power level stored in its power storage devices (power storage device 28 and cold 40 and hot 42 sources) above a predetermined power threshold making it possible to start the power-generating assembly from the energy stored in the energy storage device, autonomously, without an outside power source.

The power-generating system checks the energy level in the energy storage devices at regular time intervals. In case of an energy level below the predetermined threshold, the power-generating system recharges at least one energy storage device with energy so as to go back above the predetermined threshold.

The power-generating system checks the charge level of the power storage device at regular time intervals.

If the power storage device is discharged below a predetermined threshold, the power-generating system recharges (completely or partially) the power storage device from an outside power source, for example the electric grid 26, and/or an internal energy storage device, for example from the heat energy storage device formed by the cold 40 and hot 42 sources and using the thermoelectric module 22, so as to return to a level above the predetermined threshold.

Furthermore, while waiting for a start up of the power-generating assembly, the power-generating system keeps itself under appropriate temperature conditions for the start up and operation of the power-generating assembly, preferably between 0° C. and 45° C. for the most fragile equipment.

In case of solicitation and start up of the power-generating assembly, the power-generating system keeps itself under security conditions irrespective of the outside conditions, without energy or fluid exchanges with the outside.

This is in particular made possible owing to the fuel and oxidizer storage means (fuel 14 and oxidizer 16 source) and the internal power sources (power storage device 28 and thermoelectric module 22).

The invention applies to a power-generating system usable to supply back up power for sensitive buildings such as a hospital, a data center or a nuclear power plant.

What is claimed is:

1. A power-generating system comprising:
    a fluid-tight chamber;
    an electricity-generating assembly arranged in the chamber, the electricity-generating assembly including a fuel cell for generating power by an oxidation-reduction reaction between an oxidizer and a fuel, a supply system for supplying the oxidizer and the fuel to the fuel cell, and a power converter positioned inside the chamber and configured to exchange electricity with the fuel cell;

a power storage device to provide or store electricity, the power converter configured to exchange electricity with at least one of the power storage device, a thermoelectric module and a power grid; and a heat-control system including a cold source and a hot source, the heat-control system including a heat-transport fluid circuit that is configured to control the temperature of the electricity-generating assembly by exchanging heat with the cold source and the hot source.

2. The system as recited in claim 1 wherein at least one of the cold source and the hot source is positioned outside the chamber.

3. The system as recited in claim 1 wherein the cold source is a heat transport fluid reservoir.

4. The system as recited in claim 1 wherein the hot source is a phase change material heat storage device, the heat transport fluid circuit includes a hot source heat exchanger for a heat exchange between the heat transport fluid and the phase change material.

5. The system as recited in claim 1 wherein the heat transport fluid circuit includes a fuel cell heat exchanger for individual heat control of the fuel cell.

6. The system as recited in claim 1 wherein the supply system includes a fluid management unit configured to control the supply of the oxidizer and the fuel to the fuel cell.

7. The system as recited in claim 6 wherein the heat transport fluid circuit includes a fluid management unit heat exchanger for individual heat control of the fluid management unit.

8. The system as recited in claim 1 wherein the heat transport fluid circuit includes a power converter heat exchanger for individual heat control of the power converter.

9. The system as recited in claim 1 wherein the electricity-generating assembly includes the thermoelectric module, the thermoelectric module being configured to generate power due to a temperature difference.

10. The system as recited in claim 1 wherein the heat transport fluid circuit includes a heat exchanger of the thermoelectric module for individual heat control of the thermoelectric module.

11. The system as recited in claim 1 wherein the heat transport fluid circuit includes at least one chamber heat exchanger for exchanging heat between the inner volume of the chamber and the heat transport fluid.

12. The system as recited in claim 1 wherein the chamber includes at least two separate compartments, the heat control system including a chamber heat exchanger in each of the compartments for exchanging heat between the inner volume of the compartment and a heat transport fluid.

13. The system as recited in claim 12 wherein the fuel cell and the supply system are positioned in one of the compartments, the power converter and the energy storage system being positioned in another of the compartments.

14. The system as recited in claim 1 wherein the chamber is surrounded by a thermally insulating layer.

15. The system as recited in claim 1 wherein the hot source has a thermally insulating outer enclosure.

16. The system as recited in claim 1 further comprising at least one of a fuel source and an oxidizer source positioned at least one of inside the chamber and outside the chamber.

17. An operating method for a power-generating system including an electricity-generating assembly for producing power, and at least one power storage device, the method comprising:

while waiting for the power-generating assembly to start up, using the power-generating system to keep the energy level in the or each energy storage device above a predetermined energy threshold making it possible to start the power-generating assembly.

18. The method as recited in claim 17 wherein the electricity-generating assembly produces power from a fuel and an oxidizer.

* * * * *